United States Patent
Choi et al.

(10) Patent No.: US 12,027,381 B2
(45) Date of Patent: Jul. 2, 2024

(54) APPARATUS FOR TREATING SUBSTRATE AND METHOD FOR TREATING SUBSTRATE

(71) Applicant: SEMES CO., LTD., Chungcheongnam-do (KR)

(72) Inventors: Youngseop Choi, Chungcheongnam-do (KR); Young Hun Lee, Chungcheongnam-do (KR); Jinwoo Jung, Seoul (KR); Miso Park, Daejeon (KR)

(73) Assignee: SEMES CO., LTD., Chungcheongnam-do (KR)

( * ) Notice: Subject to any disclaimer, the term of this patent is extended or adjusted under 35 U.S.C. 154(b) by 796 days.

(21) Appl. No.: 17/137,181

(22) Filed: Dec. 29, 2020

(65) Prior Publication Data
US 2021/0202271 A1 Jul. 1, 2021

(30) Foreign Application Priority Data
Dec. 31, 2019 (KR) .................. 10-2019-0179294

(51) Int. Cl.
*B08B 3/08* (2006.01)
*B08B 3/10* (2006.01)
(Continued)

(52) U.S. Cl.
CPC .......... *H01L 21/67034* (2013.01); *B08B 3/08* (2013.01); *B08B 3/10* (2013.01);
(Continued)

(58) Field of Classification Search
CPC ......... H01L 21/67034; H01L 21/67207; H01L 21/67023; H01L 21/67167;
(Continued)

(56) References Cited

U.S. PATENT DOCUMENTS
10,109,506 B2 * 10/2018 Kim .................. H01L 21/02101

FOREIGN PATENT DOCUMENTS
JP 2007-175559 A 7/2007
JP 2007175559 A 7/2007
(Continued)

OTHER PUBLICATIONS

Office Action for related Korean Patent Application No. 10-2019-0179294, mailed on Mar. 17, 2021 (6 pages).

*Primary Examiner* — John P McCormack
(74) *Attorney, Agent, or Firm* — Procopio, Cory, Hargreaves & Savitch LLP (57) ABSTRACT

Embodiments of the inventive concept provide an apparatus for treating a substrate. According to an exemplary embodiment, an apparatus for treating a substrate comprises a first valve and a second valve sequentially installed along a direction from a fluid supplying source to a high-pressure chamber in the supply line; a branch line branching from the supply line between the first valve and the second valve and connected to an exhaust line; a third valve installed on the branch line; an exhaust unit exhausting the process fluid inside the high-pressure chamber; and a controller, wherein the controller is configured to perform, before a transfer robot transfers the substrate to the high-pressure chamber for treating the substrate, a first operating of opening the first valve and closing the second valve and a third valve, and a second operating of closing the first valve and the second valve, and opening the third valve.

14 Claims, 9 Drawing Sheets

(51) Int. Cl.
  *B08B 7/00* (2006.01)
  *B08B 13/00* (2006.01)
  *H01L 21/67* (2006.01)
  *H01L 21/687* (2006.01)

(52) U.S. Cl.
  CPC ............ *B08B 7/0021* (2013.01); *B08B 13/00* (2013.01); *H01L 21/67207* (2013.01); *H01L 21/67023* (2013.01); *H01L 21/67167* (2013.01); *H01L 21/68707* (2013.01)

(58) Field of Classification Search
  CPC ......... H01L 21/68707; H01L 21/67017; H01L 21/67748; H01L 21/67051; H01L 21/6704; H01L 21/02101; H01L 21/67742; B08B 3/08; B08B 3/10; B08B 7/0021; B08B 13/00
  USPC ............................................................ 34/90
  See application file for complete search history.

(56) References Cited

FOREIGN PATENT DOCUMENTS

| | | | |
|---|---|---|---|
| JP | 2007-234862 | A | 9/2007 |
| JP | 2007234862 | A * | 9/2007 |
| JP | 2012114361 | A | 6/2012 |
| JP | 2013012538 | A | 1/2013 |
| JP | 2013251547 | A | 12/2013 |
| KR | 100929364 | B1 | 12/2009 |
| KR | 10-1536724 | B1 | 7/2015 |
| KR | 1020170133694 | A | 12/2017 |
| KR | 101964655 | B1 | 4/2019 |
| KR | 10-2001735 | B1 | 7/2019 |
| WO | 2010/104206 | A1 | 9/2010 |

\* cited by examiner

APPARATUS FOR TREATING SUBSTRATE AND METHOD FOR TREATING SUBSTRATE

CROSS-REFERENCE TO RELATED APPLICATIONS

This application claims for priority under 35 U.S.C. § 119 to Korean Patent Application No. 10-2019-0179294 filed on Dec. 31, 2019, in the Korean Intellectual Property Office, the entire contents of which are hereby incorporated by reference.

BACKGROUND

Embodiments of the inventive concept described herein relates to an apparatus for treating a substrate and a method for treating a substrate.

A semiconductor manufacturing process comprises cleaning a thin film, a foreign substance, a particle, and the like on a substrate. As a design rule of the semiconductor device is reduced, during a drying process of a chemical solution after a wet process like an etching or a cleaning process a pattern collapse by a surface tension of a chemical solution or a pattern bridge by adjacent patterns occur frequently. Also, fine particles at a deep and narrow space between patterns cause a failure in the substrate.

Recently, a supercritical fluid is used in a process of cleaning a substrate. For example, after a substrate is treated with a treating liquid in a liquid treating chamber the substrate is transferred to a high-pressure chamber where a supercritical fluid is used to remove the treating liquid from the substrate.

In the process of removing the treating liquid by using the supercritical fluid described above, when a first substrate is treated in the high-pressure chamber not used for a predetermined period of time, a process failure rate is high.

SUMMARY

The present inventors found that a temperature (e.g., the reduction in temperature in the high-pressure chamber or a supply line) is one reason of the above-described process failure in supercritical fluid process and suggest a solution thereto.

Embodiments of the inventive concept provide an apparatus for treating a substrate and a method for treating a substrate capable of improving a treatment efficiency using a supercritical fluid for treating the substrate.

In addition, embodiments of the inventive concept provide an apparatus for treating a substrate and a method for treating a substrate capable of reducing a process failure using a supercritical fluid for treating the substrate.

The objects which will be achieved in the inventive concept are not limited to the above, but other objects, which are not mentioned, will be apparently understood to those skilled in the art.

Embodiments of the inventive concept provide an apparatus for treating a substrate. According to an exemplary embodiment, an apparatus for treating a substrate comprises a liquid treating chamber treating the substrate by supplying a liquid to the substrate; a high-pressure chamber providing a treating space where a process of treating the substrate is performed using a process fluid; a fluid supplying source providing the process fluid to the high-pressure chamber; a supply line connecting the high-pressure chamber and the fluid supplying source; a first valve and a second valve sequentially installed along a direction from the fluid supplying source to the high-pressure chamber on the supply line; a branch line branching from the supply line between the first valve and the second valve and connected to an exhaust line; a third valve installed on the branch line; an exhaust unit exhausting the process fluid inside the high-pressure chamber; a transfer robot transferring the substrate between the liquid treating chamber and the high-pressure chamber; and a controller, wherein the controller is configured to perform, before the transfer robot transfers the substrate to the high-pressure chamber for treating the substrate, a first operating state opening the first valve and closing the second valve and the third valve, and a second operating state closing the first valve and the second valve, and opening the third valve to exhaust the remaining process fluid inside the supply line.

According to an exemplary embodiment, the controller is configured to perform the first operating state and the second operating state in multiple times.

According to an exemplary embodiment, the controller is configured to perform the first operating state and the second operating state during the substrate is treated in the liquid treating chamber.

According to an exemplary embodiment, an internal pressure of the supply line may decompress to atmospheric pressure according to an opening of the third valve.

According to an exemplary embodiment, in the high-pressure chamber, the substrate may be treated by using the process fluid in a supercritical phase.

According to an exemplary embodiment, the process fluid may be carbon dioxide.

According to an exemplary embodiment, the fluid supplying source may supply the process fluid in a supercritical phase to the high-pressure chamber.

Embodiments of the inventive concept provide another apparatus for treating a substrate. According to an exemplary embodiment, an apparatus for treating a substrate comprises a liquid treating chamber treating the substrate by supplying a liquid to the substrate; a high-pressure chamber providing a treating space where a process of treating the substrate is performed using a process fluid; a fluid supplying source providing the process fluid to the high-pressure chamber; a supply line connecting the high-pressure chamber and the fluid supplying source; a first valve and a second valve sequentially installed along a direction from the fluid supplying source to the high-pressure chamber on the supply line; a branch line branching from the supply line between the first valve and the second valve and connected to an exhaust line; a third valve installed on the branch line; an exhaust unit exhausting the process fluid inside the high-pressure chamber; a transfer robot transferring the substrate between the liquid treating chamber and the high-pressure chamber; and a controller, wherein the controller is configured to perform, before the transfer robot transfers the substrate to the high-pressure chamber for treating the substrate, a first operating state opening the first valve and the second valve and closing the third valve, and a second operating state closing the first valve and the second valve, and opening the third valve to exhaust the remaining process fluid inside the supply line.

According to an exemplary embodiment, the controller is configured to perform the first operating state and the second operating state for performing in multiple times.

According to an exemplary embodiment, the controller is configured to perform the first operating state and the second operating state during the substrate is treated in the liquid treating chamber.

In addition, embodiments of the inventive concept provide a method for treating a substrate using an apparatus for treating a substrate. According to an exemplary embodiment, the apparatus for treating a substrate comprises a liquid treating chamber treating the substrate by supplying a liquid to the substrate; a high-pressure chamber providing a treating space where a process of treating the substrate is performed using a process fluid; a fluid supplying source providing the process fluid to the high-pressure chamber; a supply line connecting the high-pressure chamber and the fluid supplying source; a first valve and a second valve sequentially installed along a direction from the fluid supplying source to the high-pressure chamber on the supply line; a branch line branching from the supply line between the first valve and the second valve and connected to an exhaust line; a third valve installed on the branch line; an exhaust unit exhausting the process fluid inside the high-pressure chamber; a transfer robot transferring the substrate with respect to the liquid treating chamber and the high-pressure chamber. According to embodiments of the inventive concept, the method for treating a substrate comprise performing, before the transfer robot transfers the substrate to the high-pressure chamber for treating the substrate, a first operating state opening the first valve and closing the second valve and the third valve, and a second operating state closing the first valve and the second valve, and opening the third valve to exhaust the remaining process fluid inside the supply line.

According to an exemplary embodiment, the first operating state and the second operating state are performed in multiple times.

According to an exemplary embodiment, the first operating state and the second operating state are performed during the substrate is treated in the liquid treating chamber.

According to an exemplary embodiment, the process fluid may be carbon dioxide.

According to an exemplary embodiment, a treatment efficiency may be improved by using the supercritical fluid for treating the substrate.

In addition, according to an exemplary embodiment, a process failure may be reduced by using the supercritical fluid for treating the substrate.

The inventive concept and methods of accomplishing the same may be understood more readily by reference to the following detailed description of embodiments and the accompanying drawings. However, the inventive concept may be embodied in many different forms, and should not be construed as being limited to the embodiments set forth herein. Rather, these embodiments are provided so that this inventive concept will be thorough and complete and will fully convey the concept of the invention to those skilled in the art, and the inventive concept will only be defined by the appended claims.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes of the components in the drawings are exaggerated to emphasize clearer descriptions.

Figure 1:
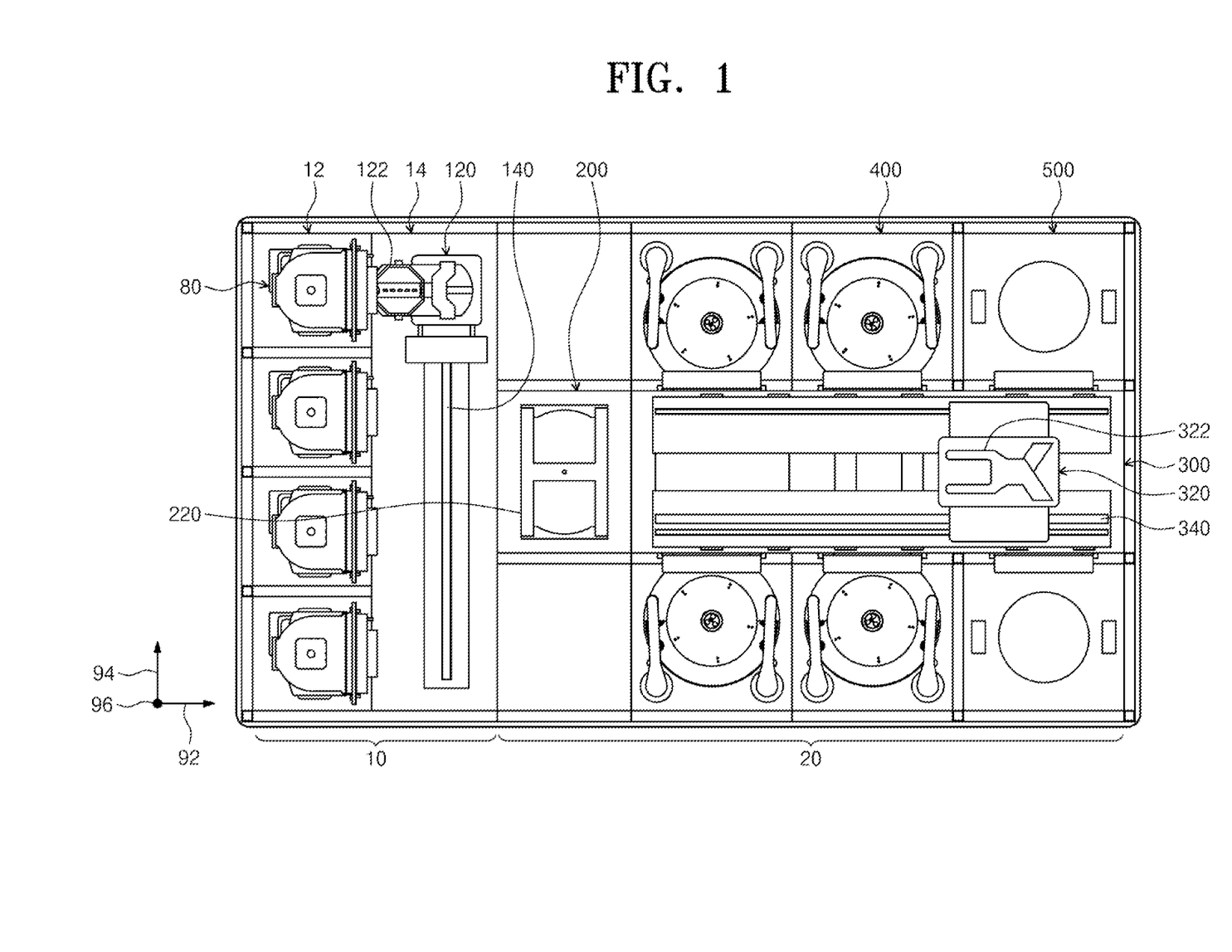
FIG. 1 is a plan view schematically showing an apparatus for treating a substrate, according to an embodiment of the inventive concept.

FIG. 1 is a plan view schematically showing an apparatus for treating a substrate, according to an embodiment of the inventive concept.

Referring to FIG. 1, the apparatus for treating the substrate comprises an index module 10, a treating module 20, and a controller (not shown). According to an exemplary embodiment, the index module 10 and the treating module 20 are arranged along certain direction. Hereinafter, a direction in which the index module 10 and the treating module 20 are arranged will be referred to as a first direction 92, a direction that is perpendicular to the first direction 92 when viewed from the top will be referred to as a second direction 94, and a direction perpendicular to all the first direction 92 and the second direction 94 will be referred to as a third direction 96.

The index module 10 transfers a substrate 'W' to the treating module 20 from a container 80 containing the substrate 'W', and transfers back the substrate 'W' treated in the index module 20 to the container 80. The longitudinal direction of the index module 10 is provided in the second direction 94. The index module 10 has a load port 12 and an index frame 14. The load port 12 is positioned at an opposite side of the treating module 20, based on the index frame 14. The container 80 having substrates 'W' is placed on the load port 12. A plurality of load ports 12 may be provided and may be arranged along the second direction 94.

The container 80 may be a container for sealing like a front open unified pod (FOUP). The container 80 may be placed on the load port 12 by a transport unit (not shown) such as Overhead Transfer, Overhead Conveyor, or Automatic Guided Vehicle, or a worker.

An index robot 120 is provided inside the index frame 14. A guide rail 140, which has a longitudinal direction provided in the second direction 94, may be provided inside the index frame 14, and the index robot 120 may be movable on the guide rail 140. The index robot 120 may comprise a hand 122 in which the substrate 'W' is placed, and the hand 122 may move forward and backward, rotate about the third direction 96, and move along the third direction 96. A plurality of hands 122 are spaced vertically apart, the hands 122 independently move forward and backward.

The treating module 20 comprises a buffer unit 200, a transfer chamber 300, liquid treating chamber 400, and a high-pressure chamber 500. The buffer unit 200 provides a space to temporarily stay the substrate 'W' introduced to the treating module 20 and withdrawn from the treating module 20. The liquid treating chamber 400 performs a liquid-treating process by supplying the liquid to the substrate 'W'. The high-pressure chamber 500 performs a drying process removing the liquid remaining on the substrate 'W'. The transfer chamber 300 transfers the substrate 'W' among the buffer unit 200, the liquid treating chamber 400, and the high-pressure chamber 500.

The controller (not shown) controls an entire operation of the apparatus for treating the substrate. The controller (not shown) may comprise CPU (Central Processing Unit). For example, the controller performs a desired treatment such as a liquid treating, a dry treating or the like described hereafter, in accordance with recipes stored in a memory area, e.g., ROM, RAM, or the like. The recipe comprises a process time, a process pressure, a process temperature, and gas flow rates as control information of an apparatus with respect to a process condition. Meanwhile, the recipe can be stored in a hard disk or a semiconductor memory. In addition, the recipe can be set on a predetermined position of the memory area in CD-ROM, DVD or the like which can readable by a transportable computer.

The transfer chamber 300 has a longitudinal direction parallel to the first direction 92. A buffer unit 200 is arranged between the index module 10 and the transfer chamber 300. The liquid treating chamber 400 and the high-pressure chamber 500 are arranged at a side of the transfer chamber 300. The liquid treating chamber 400 and the high-pressure chamber 300 are arranged along the second direction 94. The high-pressure chamber 500 and the transfer chamber 300 are arranged along the second direction 94. The buffer unit 200 is positioned one end of the transfer chamber 300.

According to an exemplary embodiment, liquid treating chambers 400 are arranged both sides of the transfer chamber 300, high-pressure chambers 500 are arranged both sides of the transfer chamber 300, and liquid treating chambers 400 are positioned more closely at the buffer unit 200 than high-pressure chambers 500. At one side of the transfer chamber 300, liquid treating chambers 400 are arranged by A X B (A and B are 1 or more of natural number, respectively) along the first direction 92 and the third direction 96 respectively. In addition, at one side of the transfer chamber 300, high-pressure chambers 500 are arranged by C X D (C and D are 1 or more of natural number, respectively) along the first direction 92 and the third direction 96 respectively. Unlike described above, the liquid treating chambers 400 are provided at one side of the transfer chamber 300, and high-pressure chambers 500 are provided at the opposite side.

The transfer chamber 300 has a transfer robot 320. A guide rail 340, which has a longitudinal direction provided in the first direction 92, may be provided in the transfer chamber 300, and the transfer robot 320 may be movable on the guide rail 340. The transfer robot 320 may comprise a hand 322 in which the substrate 'W' is placed, and the hand 322 may move forward and backward, rotate about the third direction 96, and move along the third direction 96. A plurality of hands 322 are spaced vertically apart, the hands 322 independently move forward and backward.

The buffer unit 200 has a plurality of buffers 200 in which the substrate 'W' is placed. A plurality of buffers 200 may be spaced apart each other along the third direction 96. A front face and a rear face of the buffer unit 200 are opened. The front face faces the index module 10 and the rear face faces the transfer chamber 300. The index robot 120 approaches to the buffer unit 200 through the front face, and the transfer robot 320 approaches to the buffer unit 200 through the rear face.

Figure 2:
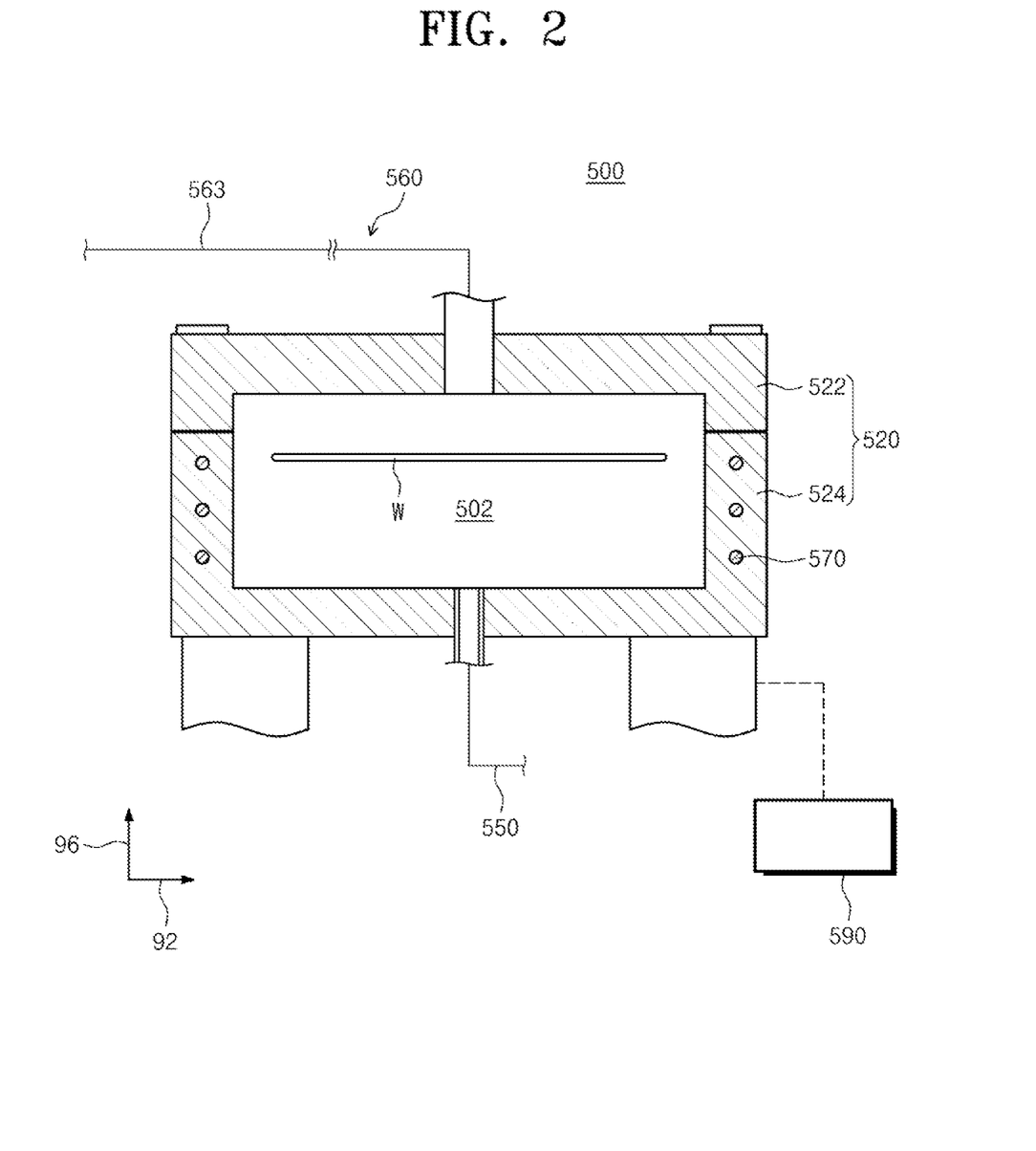
FIG. 2 schematically shows an example of a high-pressure chamber of FIG. 1.

FIG. 2 schematically shows an example of a high-pressure chamber 500 of FIG. 1. According to an exemplary embodiment, the high-pressure chamber 500 removes a liquid on the substrate 'W' using a supercritical fluid. The high-pressure chamber 500 has a body 520, a substrate support unit (not shown), fluid supply unit 560, and blocking plate (not shown).

The body 520 provides an inside space 502 where a drying process is performed. The body 520 has an upper body 522 and a lower body 524, and the upper body 522 and the lower body 524 provide the described inside space 502 by combination thereof. The upper body 522 is provided to a top portion of the lower body 524. A position of the upper body 522 is fixed, the lower body 524 is moved up and down by a driving member 590 like a cylinder. When the lower body 524 is spaced apart from the upper body 522, the inside space 502 is opened, at this time, the substrate 'W' is introduced or withdrawn. The process is performed, with the lower body 524 closely contacting with the upper body 522 to close the inside space 502 from an outside. The high-pressure chamber 500 has a heater 570. According to an exemplary embodiment, the heater 570 is positioned inside the wall of the body 520. The heater 570 heats the inside space 502 of the body 520 to maintain the fluid which supplied into the inside space of the body 520 in a supercritical phase.

On the other hand, not shown in drawings, the inside of the treating space 502 may have a substrate support unit (not shown) supporting the substrate 'W'. The support unit (not shown) supports the substrate 'W' in the inside space 502 of the body 520. The support unit (not shown) may be installed in the body 524 to support the substrate 'W'. In this case, the support unit (not shown) may be configured to lift and support the substrate 'W'. Or the support unit (not shown) may be installed in the upper body 522 to support the substrate 'W'. In the case, the support unit (not shown) may be configured to hang and support the substrate 'W'.

A fluid supply unit 560 supplies a treating fluid to the inside space 502 of the body 520. According to an exemplary embodiment, the treating fluid may be supplied to the inside space 502 in a supercritical phase. Alternatively, the treating fluid is supplied to the inside space 502 in a gas phase, and can phase-change to a supercritical phase. The treating fluid may be a drying fluid.

According to an exemplary embodiment, the fluid supply unit 560 has a supply line. The supply line supplies the treating fluid above the substrate 'W' which is placed on the substrate support unit (not shown). According to an exemplary embodiment, the supply line is coupled to the upper body 522. Further, the supply line may be coupled to a center of the upper body 522.

Or, the supply line may be branched into a third supply line 563 and a lower supply line (not shown), the third supply line 563 being coupled to the upper body 522. The lower supply line (not shown) may be coupled to the lower body 524. A distribution valve may be installed in the third supply line 563 and the lower supply line (not shown), respectively.

An exhaust line 550 is coupled to the lower body 524. The supercritical fluid in the inside space 502 of the body 520 is exhausted outside the body 520 through the exhaust line 550.

In the case the lower supply line (not shown) is coupled to the lower body 524, a blocking plate (not shown) may be arranged in the inside space 502 of the body 520. The blocking plate (not shown) may be provided in the shape of a circular disc. The blocking plate (not shown) is supported by a supporter (not shown) to space apart from a bottom surface of the body 520. The supporter (not shown) is provided in a load shape, and a plurality of supporters are arranged to space apart each other. A discharge port of the lower supply line (not shown) and an inlet of the exhaust line 550 are placed on which do not make interference. The blocking plate (not shown) prevents the treating fluid supplied through the lower supply line (not shown) from directly being discharged to and damaging the substrate 'W'.

Figure 3:
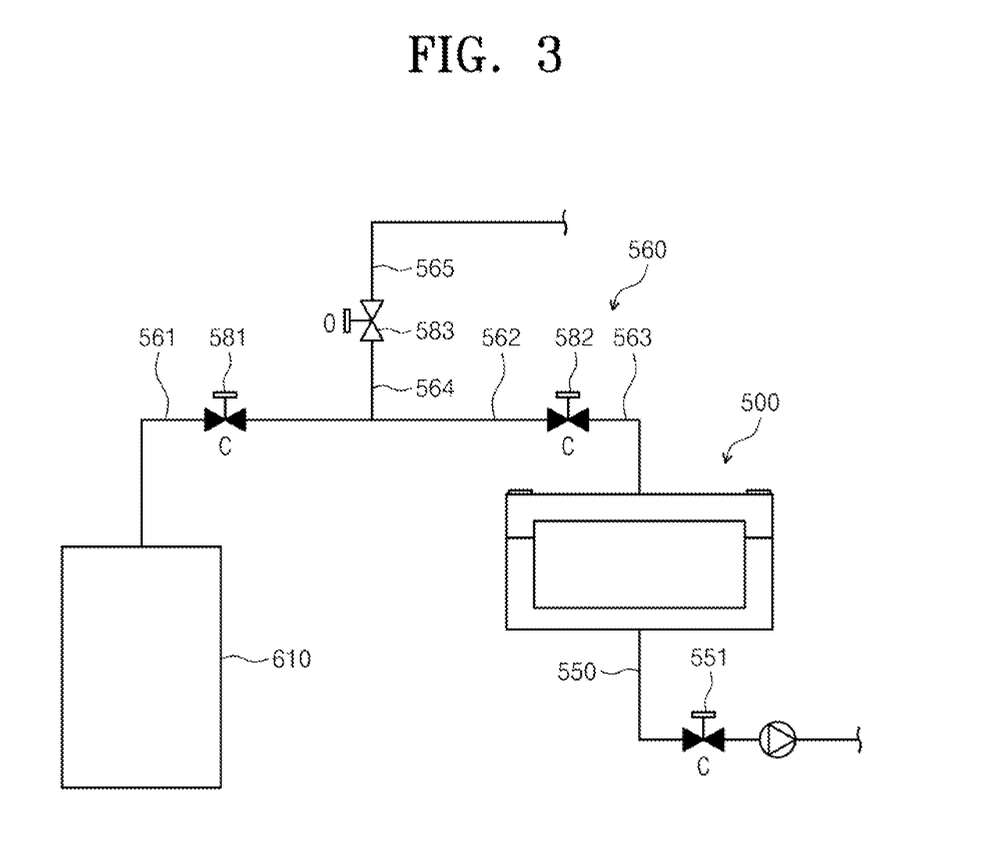
FIG. 3 is a schematic diagram showing an apparatus for treating a substrate, according to an embodiment of the inventive concept.

FIG. 3 is a schematic diagram showing the apparatus for treating a substrate, and shows an IDLE state. Referring to FIG. 3, the fluid supply unit 560 will be described.

The fluid supply unit 560 comprises a fluid supplying source 610, a first supply line 561, a second supply line 562, and a third supply line 563.

The supplying source 610 stores a process fluid supplied to the high-pressure chamber 500. For example, the fluid supplying source 610 is a storage tank or a reservoir tank. For example, the process fluid is carbon dioxide. The fluid supplying source 610 supplies the process fluid in a supercritical fluid phase to the high-pressure chamber 500.

The first supply line 561, the second supply line 562, and the third supply line 563 connect the high-pressure chamber 500 and the fluid supplying source 610. The first supply line 561, the second supply line 562, and the third supply line 563 are sequentially connected in series to supply the process fluid stored in the fluid supplying source to the high-pressure chamber 500. A first valve 581 is installed between the first supply line 561 and the second supply line 562. A second valve 582 is installed between the second supply line 562 and the third supply line 563. The third supply line 563 is connected to the top portion of the high-pressure chamber 500.

The branch line 564 is branched on the second supply line 562. The third valve 583 is provided on the branch line 564. An exhaust line 565 is provided to a downstream of the third valve. A fourth valve 551 is provided on the exhaust line 550 of the high-pressure chamber 500. When the fourth valve 551 opens, the process fluid inside the high-pressure chamber 500 is discharged to the outside of the high-pressure chamber 500. The substrate 'W' inside the high-pressure chamber 500 may be introduced into the high-pressure chamber 500 or withdrawn to the outside of the high-pressure chamber 500 by the transfer robot 320.

In the IDLE state, the first valve 581, the second valve 582, the fourth valve 551 are provided with closed state, the third valve 583 is provided with open state.

Figure 4:
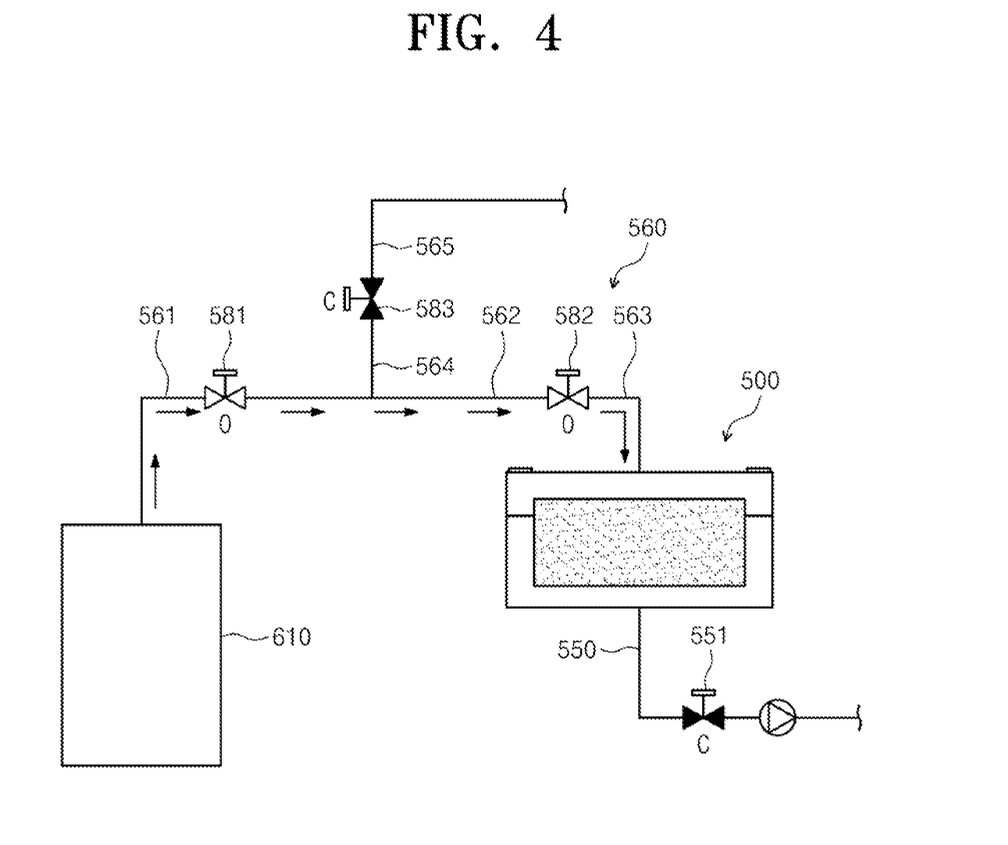
FIG. 4 shows a first operating state of an apparatus for treating a substrate according to a first embodiment of the inventive concept.
Figure 5:
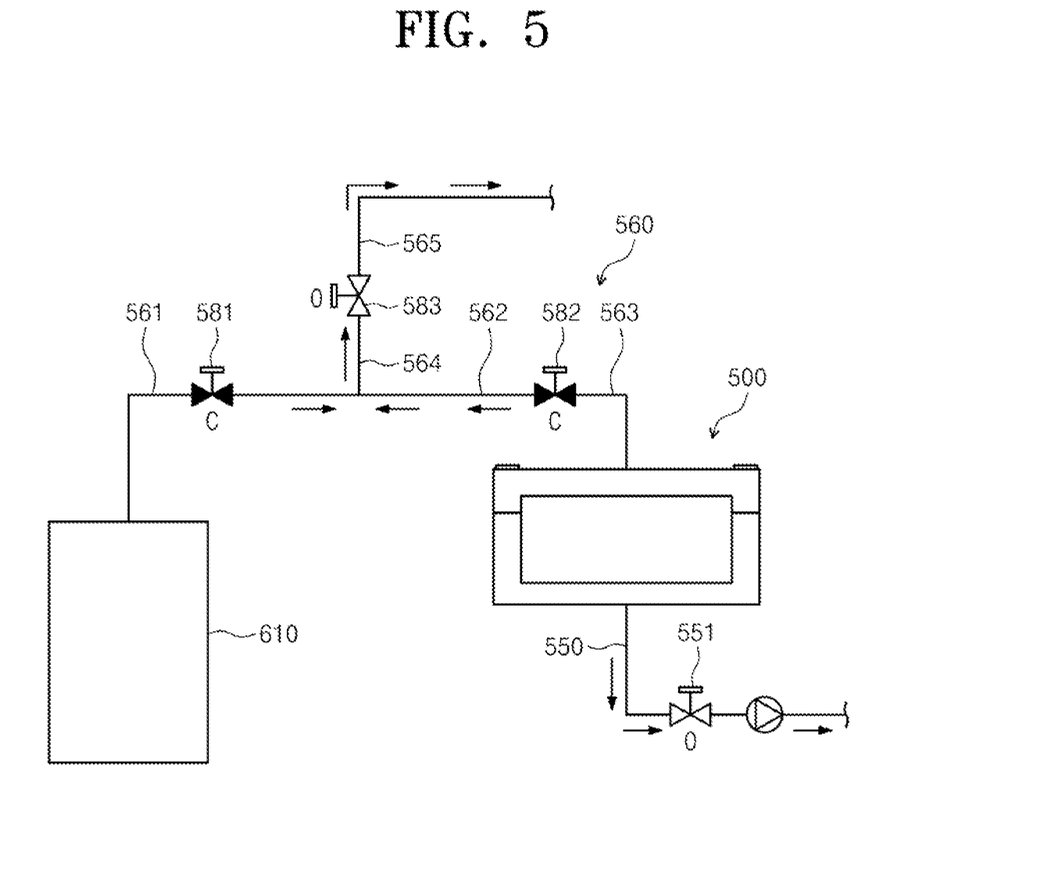
FIG. 5 shows a second operating state of an apparatus for treating a substrate according to a first embodiment of the inventive concept.
Figure 6:
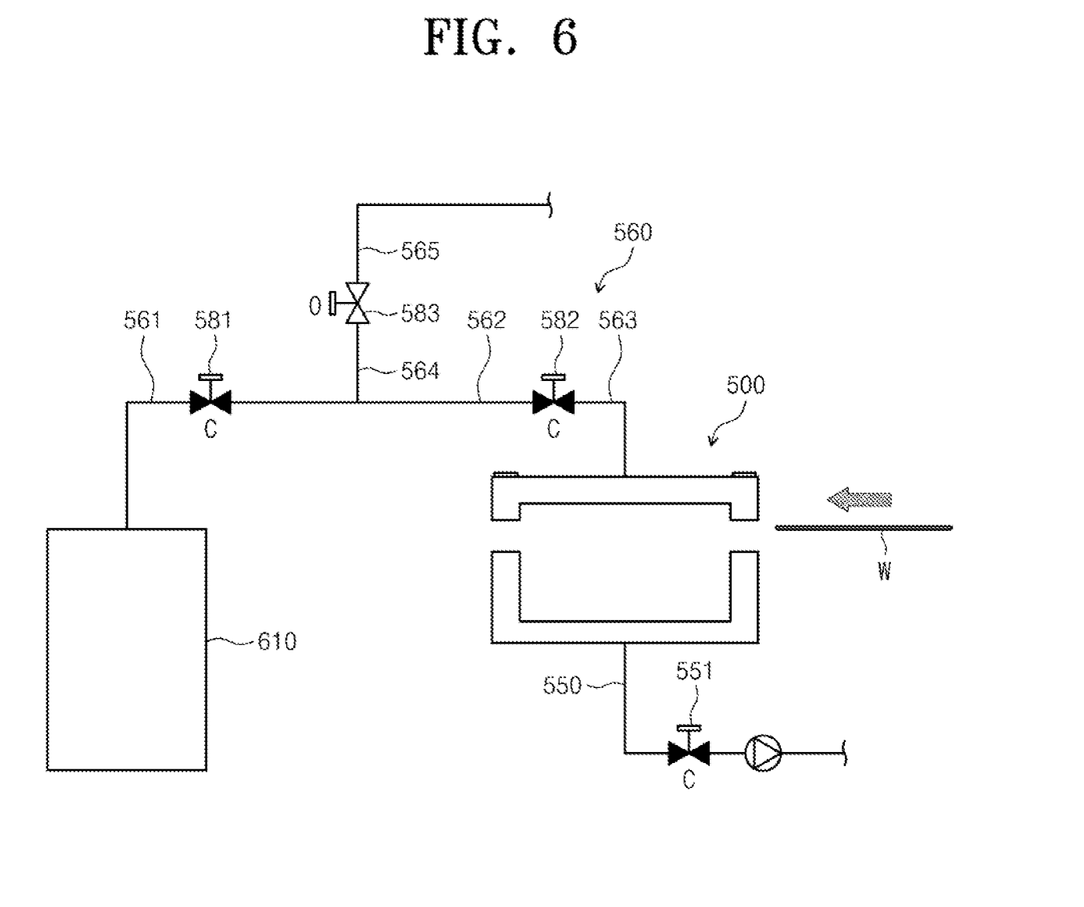
FIG. 6 shows a state that a substrate is introduced to an apparatus for treating a substrate according to a first embodiment of the inventive concept.

FIG. 4 shows a first operating state of the apparatus for treating the substrate according to a first embodiment of the inventive concept. FIG. 5 shows a second operating state of the apparatus for treating a substrate according to the first embodiment of the inventive concept. FIG. 6 shows a state that the substrate is introduced to the apparatus for treating the substrate according to the first embodiment of the inventive concept.

Referring to FIGS. 4 to 6, the operating state is described according to the first embodiment of the inventive concept.

Referring to FIG. 4, the high-pressure chamber 500 is closed without substrate 'W' inside the high-pressure chamber 500, the first valve 581 and the second valve 582 are opened during a predetermined time, and the third valve 583 and the fourth valve 584 are closed. And then, an inside temperature of the high-pressure chamber 500 increases by preheating. In addition, the first supply line 561, the second supply line 562, and the third supply line 563 are heated.

Referring to FIG. 5, when the inside of the high-pressure chamber 500 is heated to a predetermined temperature, for example the temperature range between 20 Celsius degree to 50 Celsius degree, the first valve 581 and the second valve 582 are closed, the third valve 583 and the fourth valve 551 are opened, and then the inside of the second supply line 562, the third supply line 563 and the high-pressure chamber 500 are exhausted. Accordingly, the inside of the second supply line 562, the third supply line 563 and the high-pressure chamber 500 is heated.

Referring to FIG. 6, the first valve 581, the second valve 582 and the fourth valve 551 are closed, the third valve 583 is opened, which is the IDLE state, and then the high-pressure chamber 500 is opened, and the substrate 'W' is introduced into the high-pressure chamber 500.

Figure 7:
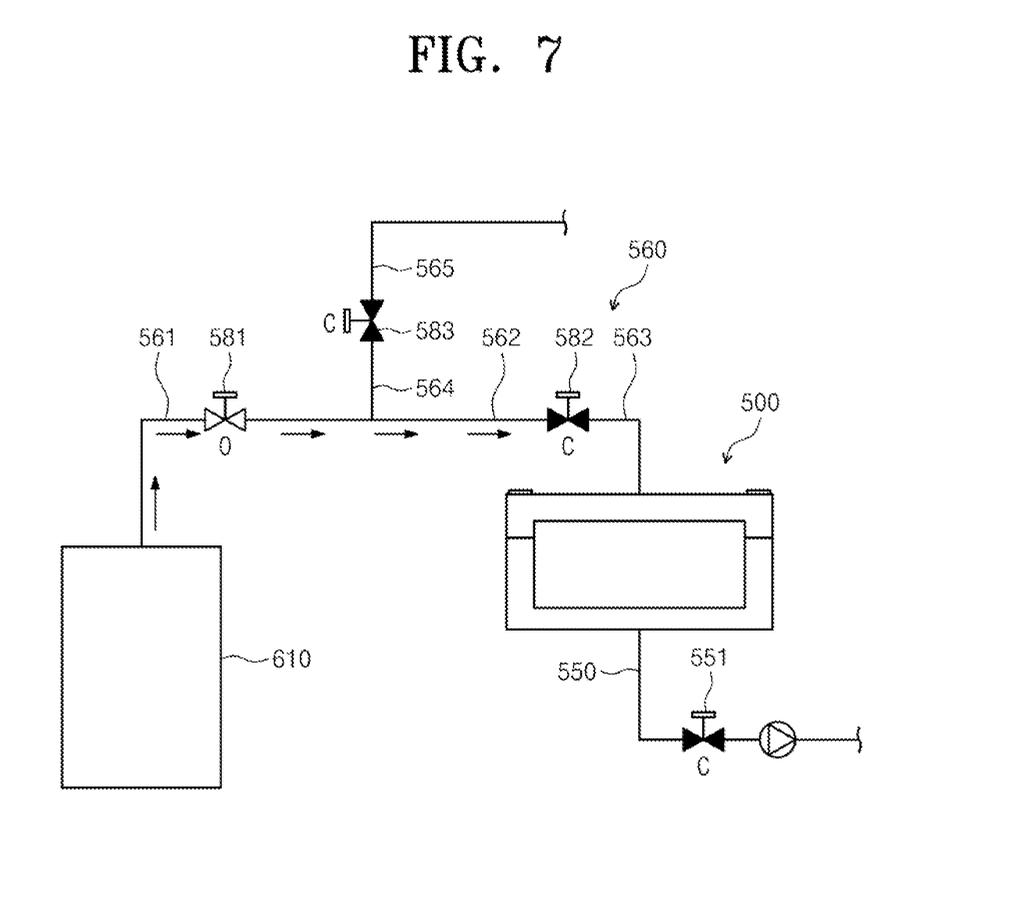
FIG. 7 shows a first operating state of an apparatus for treating a substrate according to a second embodiment of the inventive concept.
Figure 8:
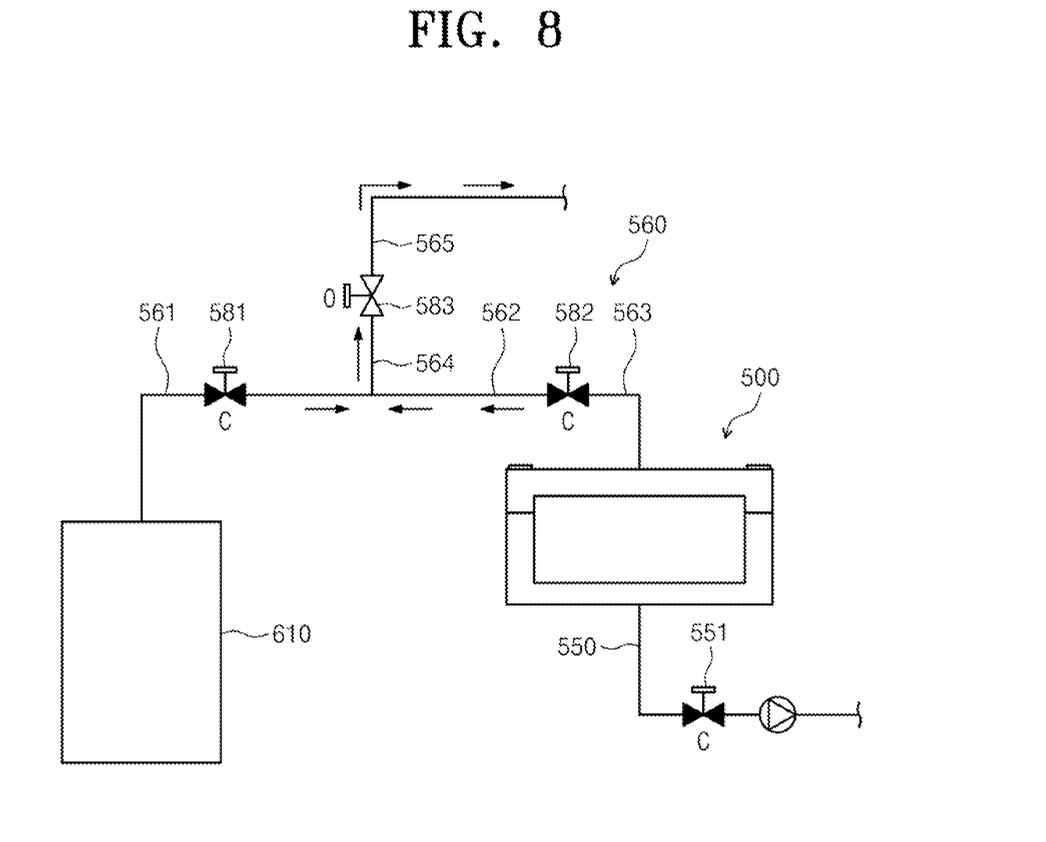
FIG. 8 shows a second operating state of an apparatus for treating a substrate according to a second embodiment of the inventive concept.
Figure 9:
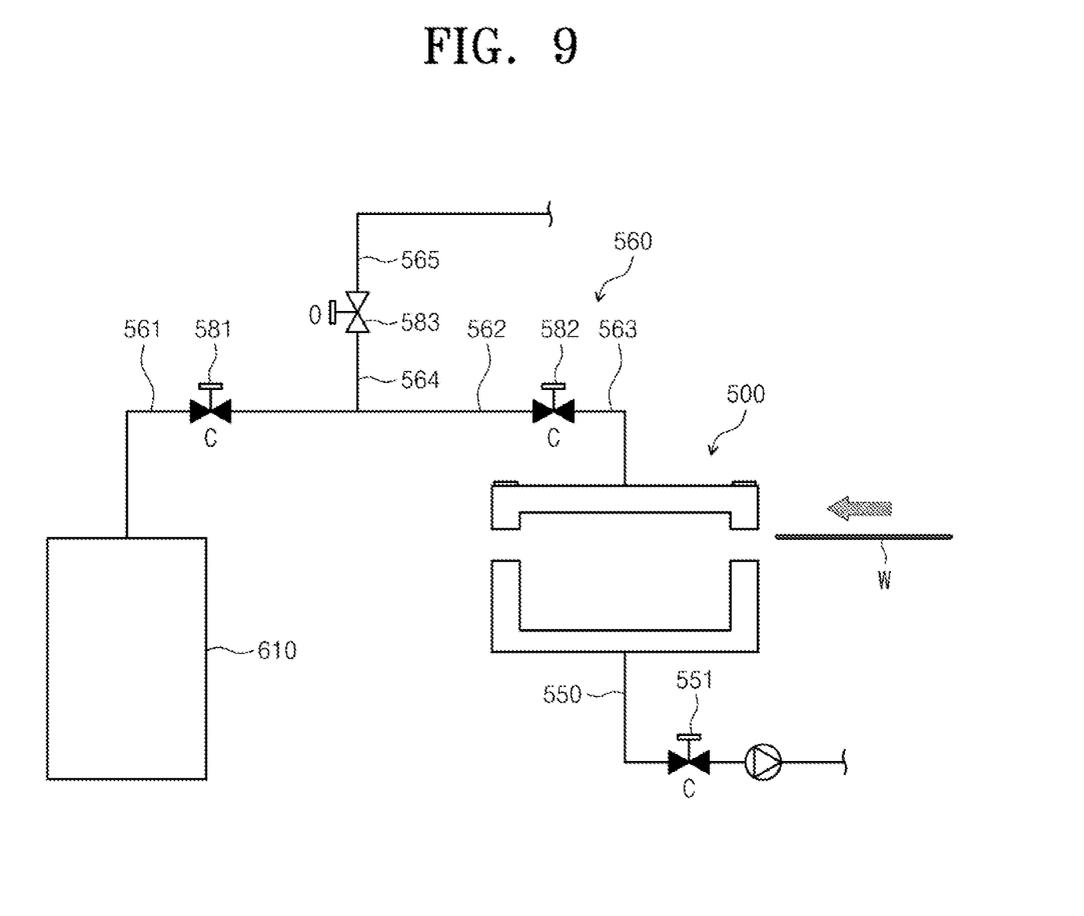
FIG. 9 shows a state that a substrate is introduced to an apparatus for treating a substrate to a second embodiment of the inventive concept.

FIG. 7 shows a first operating state of the apparatus for treating the substrate according to a second embodiment of the inventive concept. FIG. 8 shows a second operating state of the apparatus for treating the substrate according to the second embodiment of the inventive concept. FIG. 9 shows a state that the substrate is introduced to the apparatus for treating a substrate according to the second embodiment of the inventive concept.

Referring to FIGS. 7 to 9, the operating state according to the second embodiment of the inventive concept is described.

Referring to FIG. 7, the high-pressure chamber 500 is closed without the substrate 'W' inside the high-pressure chamber 500, the first valve 581 is opened during a predetermined time, and the second valve 582, the third valve 583 and the fourth valve 584 are closed. Accordingly, the second supply line 562 is heated.

Referring to FIG. 8, when the inside of the second supply line 562 is heated to a predetermined temperature, for example the temperature range between 20 Celsius degree to 50 Celsius degree, the first valve 581, the second valve 582 and the fourth valve 551 are closed, the third valve 583 is opened, and then the inside of the second supply line 562 is exhausted. Accordingly, the inside of the second supply line 562, the third supply line 563 and the high-pressure chamber 500 are heated.

The first operating state and the second operating state which are described in FIGS. 7 and 8 are repeated until the temperature of the second supply line 562 reaches to the predetermined temperature. Preferably, the first operating state and the second operating state are repeated until the temperature of the process is similar to the temperature of the second supply line 562. Preferably, the first operating state and the second operating state are repeated three to four times.

Referring to FIG. 9, the first valve 581, the second valve 582 and the fourth valve 551 are closed, the third valve 583 is opened, which is the IDLE state, and then the high-pressure chamber 500 is opened, and the substrate 'W' is introduced into the high-pressure chamber 500.

According to an exemplary embodiment of the inventive concept, it can be avoided that the temperature of the supply line in the IDLE state decreases to cause a process failure.

On the other hand, comparing the first embodiment of the inventive concept, the second embodiment of the inventive concept has a low consumption of the supercritical fluid for maintaining the pipe temperature of the supply line. For example, comparing the first embodiment of the inventive concept, the second embodiment of the inventive concept has six times low consumption of the supercritical fluid.

When the substrate 'W' is supplied to the apparatus for treating the substrate and the process is started, the liquid treating process is performed, and then the supercritical drying process is started. And there are two to three minutes between the liquid treating process and the supercritical drying process. At that time, if the supercritical fluid is supplied by predetermined rate to the supply line, the temperature of the supply line increases to the temperature of the supercritical process. Therefore the process failure by the temperature can be minimized. Thus, the first substrate issue of the supercritical drying treating can be solved.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to limit the inventive concept to the disclosed embodiments. Furthermore, it should be construed that the attached claims include other embodiments.

What is claimed is:

1. An apparatus for treating a substrate, the apparatus comprising:
    a liquid treating chamber liquid treating a substrate by supplying a liquid to the substrate;
    a high-pressure chamber providing a treating space where a process of treating the substrate is performed by using a process fluid;
    a fluid supplying source providing the process fluid to the high-pressure chamber;
    a supply line connecting the high-pressure chamber and the fluid supplying source;
    a first valve and a second valve sequentially installed along a direction from the fluid supplying source to the high-pressure chamber on the supply line;
    a branch line branching from the supply line between the first valve and the second valve;
    an exhaust line connected to the branch line;
    a third valve connected to each of the branch line and the exhaust line;
    another exhaust line exhausting the process fluid inside the high-pressure chamber;
    a transfer robot transferring the substrate between the liquid treating chamber and the high-pressure chamber; and
    a controller
        configured to perform, before the transfer robot transfers the substrate to the high-pressure chamber for treating the substrate:
            a first operating of opening the first valve, and closing the second valve and the third valve before the substrate is loaded into the high-pressure chamber to process the substrate; and
            a second operating of closing the first valve and the second valve, and opening the third valve to exhaust a remaining process fluid inside the supply line.

2. The apparatus of claim 1, wherein the controller is configured to perform the first operating and the second operating in multiple times.

3. The apparatus of claim 1, wherein the controller is configured to perform the first operating and the second operating while the substrate is liquid treated in the liquid treating chamber.

4. The apparatus of claim 1, wherein an internal pressure of the supply line decompresses to atmospheric pressure according to an opening of the third valve.

5. The apparatus of claim 1, wherein the substrate is treated by using the process fluid in a supercritical phase in the high-pressure chamber.

6. The apparatus of claim 1, wherein the process fluid is carbon dioxide.

7. The apparatus of claim 1, wherein the fluid supplying source supplies the process fluid in a supercritical phase to the high-pressure chamber.

8. An apparatus for treating a substrate, the apparatus comprising:
    a liquid treating chamber liquid treating a substrate by supplying a liquid to the substrate;
    a high-pressure chamber providing a treating space where a process of treating the substrate is performed by using a process fluid;
    a fluid supplying source providing the process fluid to the high-pressure chamber;
    a supply line connecting the high-pressure chamber and the fluid supplying source;
    a first valve and a second valve sequentially installed along a direction from the fluid supplying source to the high-pressure chamber on the supply line;
    a branch line branching from the supply line between the first valve and the second valve;
    an exhaust line connected to the branch line;
    a third valve connected to each of the branch line and the exhaust line;
    another exhaust line exhausting the process fluid inside the high-pressure chamber;
    a transfer robot transferring the substrate between the liquid treating chamber and the high-pressure chamber; and
    a controller,
        configured to perform, before the transfer robot transfers the substrate to the high-pressure chamber for treating the substrate;
            a first operating of opening the first valve and the second valve, and closing the third valve before the substrate is loaded into the high-pressure chamber to process the substrate; and
            a second operating of closing the first valve and the second valve, and opening the third valve to exhaust a remaining process fluid inside the supply line.

9. The apparatus of claim 8, wherein the controller is configured to perform the first operating and the second operating in multiple times.

10. The apparatus of claim 8, wherein the controller is configured to perform the first operating and the second operating while the substrate is liquid treated in the liquid treating chamber.

11. The apparatus of claim 8, wherein an internal pressure of the supply line decompresses to atmospheric pressure according to an opening of the third valve.

12. The apparatus of claim 8, wherein the substrate is treated by using the process fluid in a supercritical phase in the high-pressure chamber.

13. The apparatus of claim 8, wherein the process fluid is carbon dioxide.

14. The apparatus of claim 8, wherein the fluid supplying source supplies the process fluid in a supercritical phase to the high-pressure chamber.

\* \* \* \* \*